United States Patent [19]

Axtell, III

[11] 4,115,731

[45] Sep. 19, 1978

[54] SYSTEM FOR LOCATING ELECTRICAL SHORTS BY TRACKING THE PATHS OF INJECTED PULSE CURRENTS UTILIZING A VOLTAGE DIFFERENTIAL RESPONSIVE PROBE

[75] Inventor: Clyde R. Axtell, III, Dallas, Tex.

[73] Assignee: Digital Facilities, Inc., Dallas, Tex.

[21] Appl. No.: 691,475

[22] Filed: Jun. 1, 1976

[51] Int. Cl.² .............. G01R 31/08; G01R 31/28; G01R 19/16
[52] U.S. Cl. ............................ 324/52; 324/72.5; 324/73 PC; 324/133
[58] Field of Search .............. 324/51, 52, 72.5, 73 PC, 324/133, 149, 158 P

[56] References Cited

U.S. PATENT DOCUMENTS

| 2,565,307 | 8/1951 | Harding et al. | 324/52 |
| 3,303,400 | 2/1967 | Allison | 324/52 UX |
| 3,617,879 | 11/1971 | Mugnier | 324/133 X |
| 3,619,775 | 11/1971 | Naylor et al. | 324/133 X |
| 3,742,351 | 6/1973 | Palmer et al. | 324/133 X |
| 3,805,155 | 4/1974 | Tsuda et al. | 324/133 |

FOREIGN PATENT DOCUMENTS

| 2,050,705 | 4/1971 | Fed. Rep. of Germany | 324/51 |
| 1,330,412 | 9/1973 | United Kingdom | 324/51 |

Primary Examiner—Gerard R. Strecker
Attorney, Agent, or Firm—Jack A. Kanz

[57] ABSTRACT

Disclosed is a system for locating electrical shorts between a pair of conductors. A current is tracked along the conductors and/or their branch conductors until the current path disappears at a location where there is no intentional conductor branching.

12 Claims, 6 Drawing Figures

SYSTEM FOR LOCATING ELECTRICAL SHORTS BY TRACKING THE PATHS OF INJECTED PULSE CURRENTS UTILIZING A VOLTAGE DIFFERENTIAL RESPONSIVE PROBE

This invention relates to electronics and more particularly to locating circuit faults.

Like most or all manufactures, printed circuit boards (PCBs) are subject to defects caused during production. One of the most common PCB defects is an unintentional shorting of PCB conductive strips, the short usually being brought about by faulty etching or soldering. Since a PCB commonly comprises a complex and sizeable array of conductive strips, it is at best difficult and time consuming to locate and correct the short. Some manufacturers may immediately discard or scrap a short-containing PCB, whether it bears components or not, because of the cost of locating the short. Some manufacturers employ a "cut and try" salvage procedure which entails actually cutting one of the shorted conductive strips at intervals and checking continuity, with say an ohmmeter, to determine which side of a cut the short is on. If after typically three to five cuts the short is not located, the board is usually considered unsalvageable and/or irreparable and is discarded or scrapped, because all such cuts reduce its reliability.

Other approaches to locating PCB shorts involve injecting pulses into the shorted conductive strips and probing the field above the PCB. However, capacitance across the shorted conductive strips can have an integrating effect, causing the pulse to smear and the radiated field to decrease below system sensitivity. Also, the field probe size can be relatively large and preclude resolution between closely spaced, narrow width strips.

In accordance with the present invention there is featured a system which permits the locating of PCB shorts and, moreover, which overcomes the aforementioned limitations. These and other features, objects and advantages of the invention will become more apparent upon reference to the following specification, claims, and appended drawings, wherein:

Figure 1:
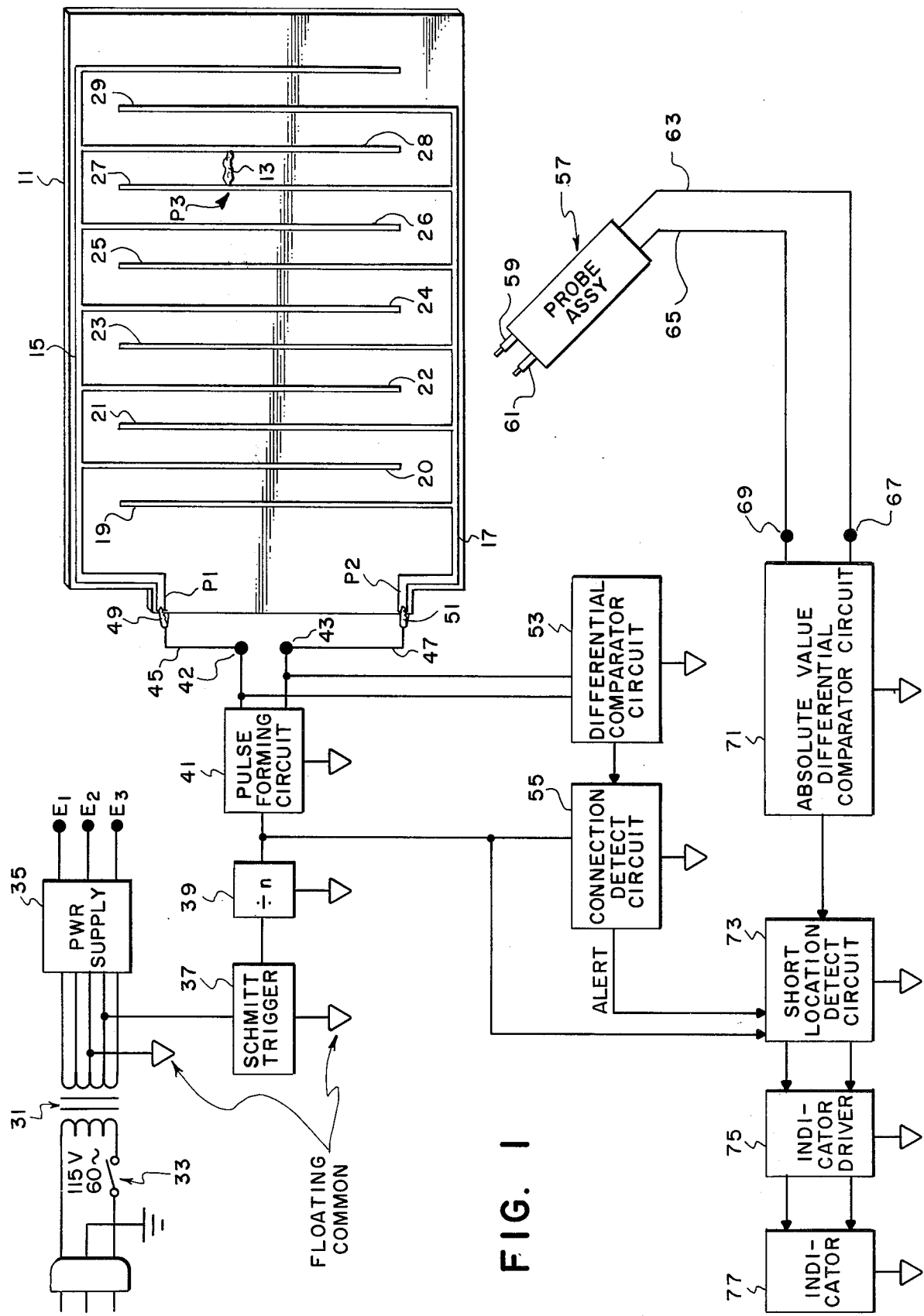
FIG. 1 is a block circuit diagram illustrating the presently preferred system embodiment, and also illustrates a PCB connected thereto.
Figure 3:
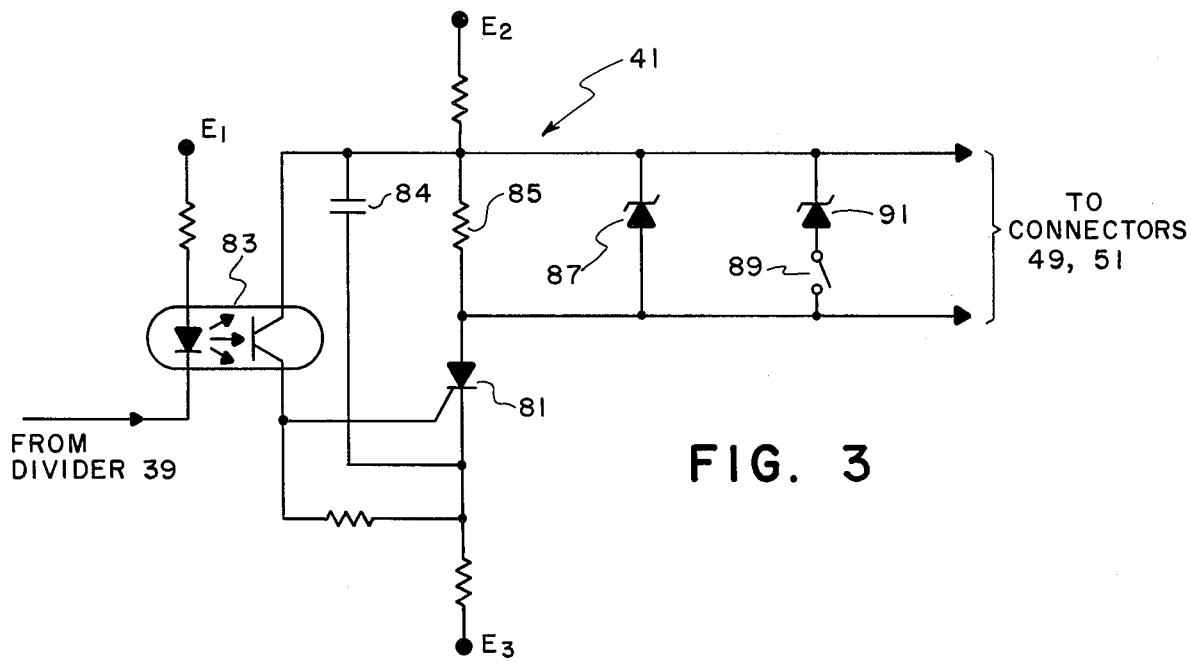
Figure 4:
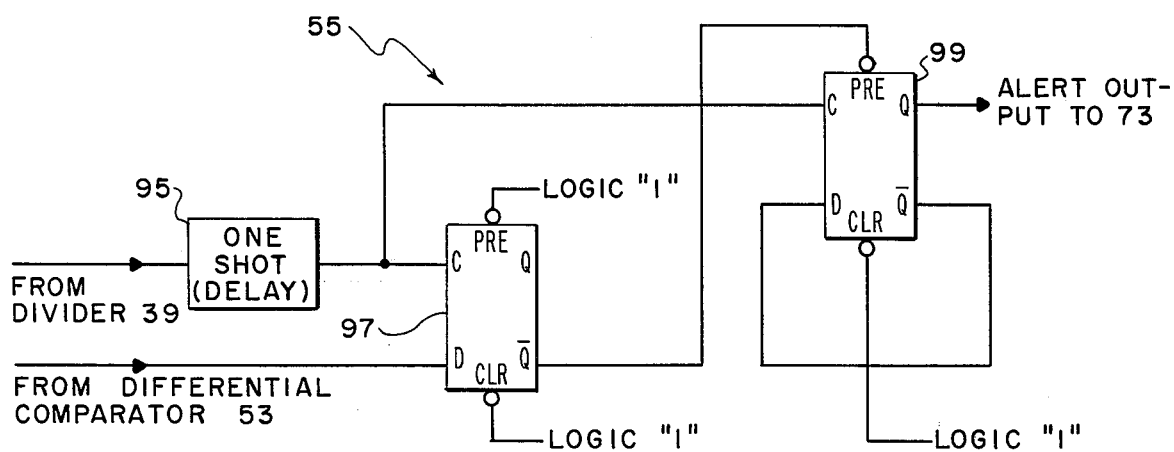
Figure 5:
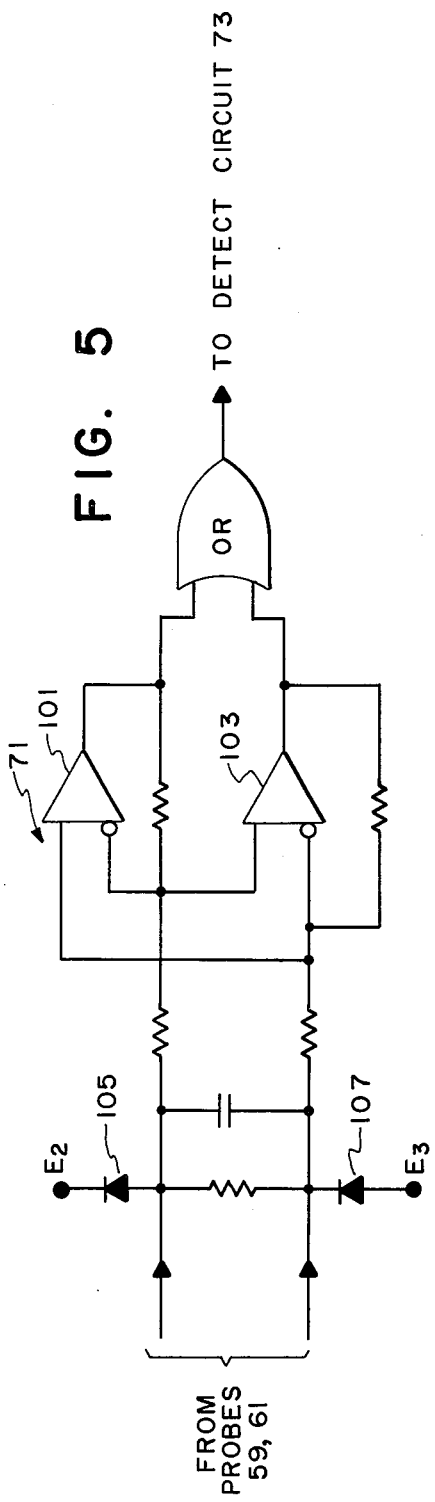
Figure 6:
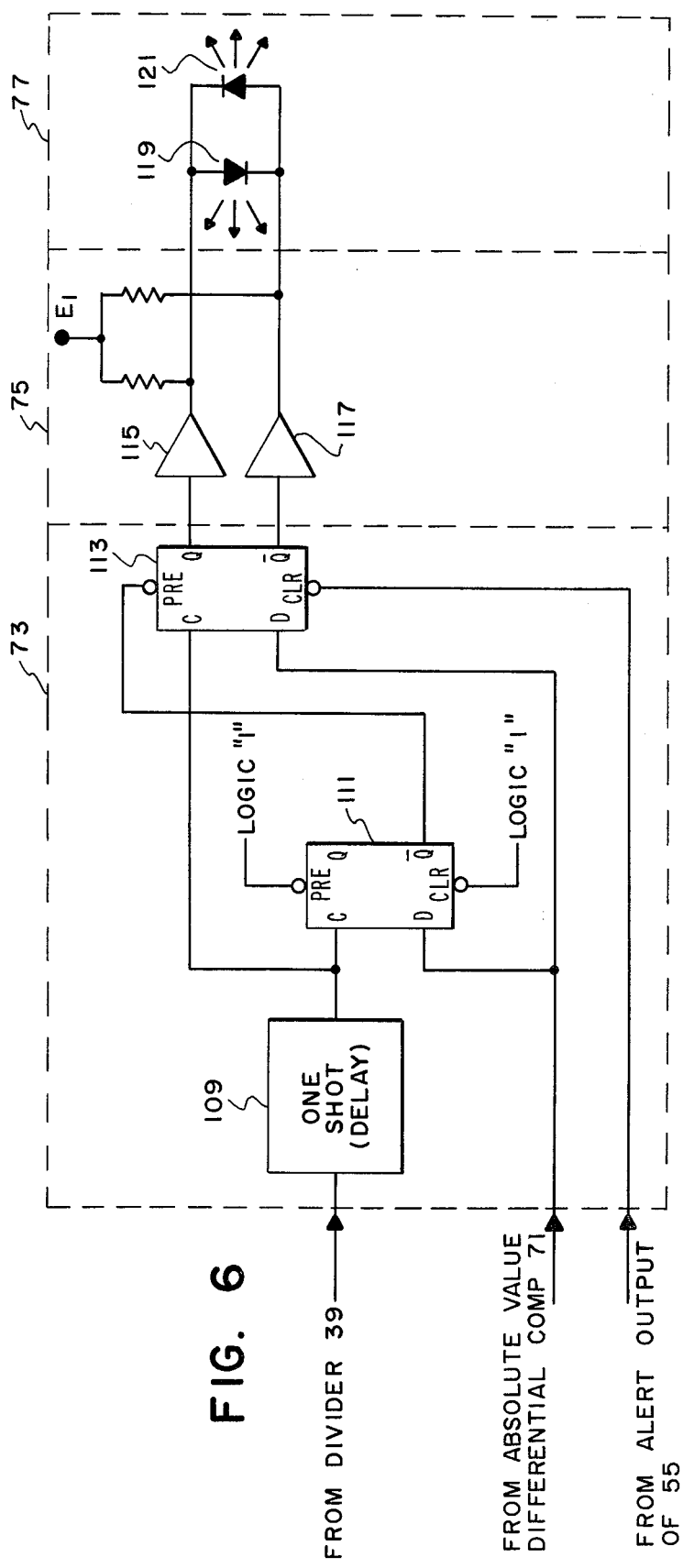

FIGS. 3, 4 and 5 are schematic diagrams of the FIG. 1 items 41, 55, and 71 respectively; and FIG. 6 is a schematic diagram of the FIG. 1 items 73, 75, and 77.

The presently preferred embodiment and a representative application thereof are illustrated in FIG. 1. Therein is shown a PCB 11 containing a short 13 and about to undergo testing by the illustrated system. Generally, prior to testing, all that is known about the PCB is that conductive strips 15 and 17 are somehow unintentionally shorted together. The object of course is to locate the short 13 so that it may be removed. Briefly prefacing more detailed explanations and descriptions hereinbelow, pulses are injected into the short circuit path at convenient locations such as at P1, P2. The PCB is otherwise unpowered. Then, starting at either injection point the operator, at arbitrary test intervals, touches both probes 59, 61 simultaneously to the conductive strips. When both probes are on the current path, the indicator so informs the operator and the operator proceeds testing along this conductor. When one or both of the probes is no longer on the current path, the indicator will so inform the operator and the operator will backtrack to the nearest junction and follow one of the other conductors leading therefrom. This procedure is repeated until the current path indication disappears at a location where there is no intentional conductor branching. Of course, intentional branching includes feedthroughs to the other side of the board. Relating the procedure to FIG. 1, say the operator starts at P2 and tests along conductor 17 until reaching conductor 19. A test along conductor 19 indicates the lack of current therein and quickly informs the operator to return to conductor 17. This same basic procedure is repeated, testing 21, 23 and 25 along the way, until reaching conductor 27, at which time a further test along one or both conductor 27 and conductor 17 informs the operator to follow conductor 27. Testing along conductor 27, one or both probes loses contact with the current path around point P3, and the indicator so informs the operator. There being no intentional or normal branching at P3, the operator knows that this is the location of the short.

Turning now to the system portion of FIG. 1, it should first be pointed out that the secondary winding of transformer 31 and all downstream elements are not referenced to earth ground or any absolute potential and are thus floating. This permits all system outputs to and inputs from the PCB to float and thus greatly reduces the possibility of unintentionally inducing currents on the PCB which can damage ICs or other PCB components. For example, such currents could be occasioned by a soldering iron or by a static discharge. A common, or floating bus, (represented in FIG. 1 by downward pointing triangles) constitutes the reference for all potentials on the secondary or output side of the transformer.

Following closure of switch 33, transformer 31 receives 115 volts, 60 Hz, and outputs several AC voltages to power supply 35 which produces floating DC supply voltages $E_1$, $E_2$, $E_3$ for the various system elements. In the present embodiment $E_1$, $E_2$, and $E_3$ are respectively 5 volts, 12.6 volts, and $-5.6$ volts with respect to common. Schmitt trigger 37, receiving a 60 Hz sinusoid from one of the transformer secondary taps, provides a 60 Hz square wave to the divide-by-n-circuit 39, which in turn outputs, since in the preferred embodiment $n=10$, a 6 Hz signal. Divide-by-n-circuit 39 comprises a series of flip-flops appropriately coupled as is known in the art to produce the desired divisor.

Pulse forming circuit 41, triggered by the divider 39 output, produces a 6 Hz pulse train in differential form between its output terminals 42 and 43. Two leads 45 and 47, each preferably having a small clip-on connector 49, 51 at one end, provide connection between terminals 41 and 43 and the PCB short circuit path. Pulse forming circuit 41 should, of course, be of a type suitable for driving an extremely low impedance load. The presently preferred embodiment of pulse forming circuit 41 is shown in FIG. 3 and will be described in more detail hereinafter. With respect to the pulse characteristics, peak pulse amplitude is nominally either 2 volts or 4 volts as selected by the operator. The 4 volt pulse is seldom required but is highly advantageous when tracking very heavy busses. Open circuit or no load pulse width is approximately 600 microseconds. With circuit 41 driving a PCB short circuit, output pulse width is usually considerably less but varies depending on the exact impedance presented by the PCB load. Operating into typical loads, the minimum pulse width is approximately 50 microseconds.

The pulse train output of circuit 41 is connected internally to a high input impedance differential comparator circuit 53 which in turn outputs a first logic level as long as the voltage differential at its input exceeds a predetermined minimum differential. Circuit 53 outputs a second logic level when its input voltage differential is less than said predetermined minimum. Connection detect circuit 55 receives the comparator circuit 53 output and produces an alert signal until pulse forming circuit 41 and the PCB are properly connected. In the preferred embodiment, the presence of the alert signal is manifested by a flashing indicator. As will become more apparent when reference is made hereinbelow to the more detailed drawings, circuit 55 detects the difference between load or no load conditions and outputs accordingly by comparing the width of the pulses at the output of pulse forming circuit 41 against a predetermined reference.

Probe assembly 57 contains probes 59 and 61, each of which is connected via one of leads 63 and 65 to one of input terminals 67 and 69 of absolute value differential comparator circuit 71. Comparator circuit 71 outputs a first logic level so long as the absolute value of the voltage differential at its input exceeds a predetermined minimum differential, and outputs a second logic level when the absolute value of said input differential voltage is less than said predetermined minimum. The voltage gain of comparator 71 is preferably very high and is presently about 50,000. The absolute value feature of the comparator circuit 71 is preferred for the reason that the operator need not concern himself with deciding the direction of current flow and assuring appropriate alignment of the probe tips therewith. That is, the system will work properly regardless of which probe tip is at the more positive potential or polarity.

As shown, short location detect circuit 73 is connected to receive the output of divider 39, the output of circuit 55 and the output of comparator circuit 71. Circuit 73 provides two outputs to indicator driver 75, which amplifies the outputs of 73 so as to produce appropriate energization of indicator 77.

Indicator 77 presently comprises a pair of LEDs, one red and one green. More detail is provided in FIG. 6 and the associated description hereinbelow, but briefly, when the alert signal from 55 is present, the red LED flashes on and off. When the alert signal is absent but no minimum voltage differential is present between probes 59 and 61, the red LED stays on constantly. After two successive pulses are received by the probes, the red LED goes off and the green LED comes on and remains on as long as the probes continue to receive pulses.

Figure 2:
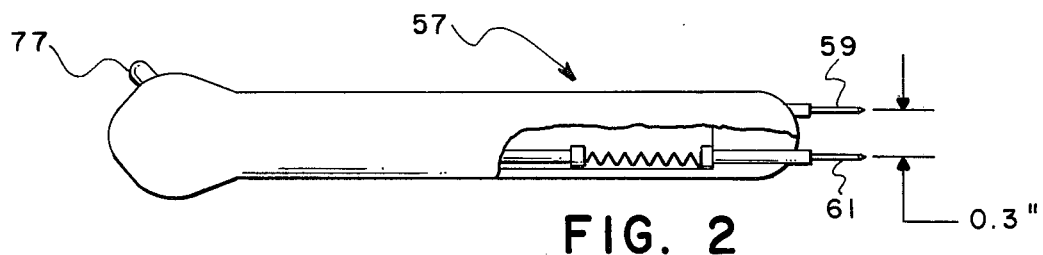
FIG. 2 is a partially cut-away side view of a probe assembly and illustrates certain presently preferred details thereof.

Turning now to FIG. 2, both probes 59 and 61 are received in and held by a single holder suitable for one-handed manipulation by an operator. Inside the holder the probes are arranged and maintained substantially parallel to one another, and each is spring loaded to permit simultaneous probe contact at various approach angles to the PCB. The probe tips are relatively pointed to permit resolution between closely spaced, narrow width conductors. In the present probe assembly it has been determined desirable to maintain a probe tip separation of approximately 0.3 inches. Of course, as one tip moves relative to the other (as the springs so permit) the tip separation increases but the increase is insignificant and the effective probe separation remains relatively constant. It should be noted that in the present embodiment, indicator 77 is mounted directly on the probe assembly 57 so as to provide the operator the necessary information without diverting his attention to some remote panel. It should also be noted that probes 59 and 61 need not be mounted in a single holder nor maintained a constant distance apart. For some applications it can be preferable to have two mechanically independent and separated probes instead of an integrated probe assembly.

Turning now to FIG. 3, pulse forming circuit 41 is shown therein in greater detail. The circuit is a conventional capacitive discharge circuit with SCR (silicon controlled rectifier) 81 being triggered by divider 39 output via opto-isolator 83. Energy stored in capacitor 84 is discharged through the SCR and applied across resistor 85 and the PCB short circuit path. Resistor 85 is nominally 4.7 ohms. Zener diode 87 with switch 89 open limits the output pulse amplitude to 4 volts. With switch 89 closed, zener diode 91 further limits the pulse amplitude to 2 volts.

In FIG. 4, item 95 is a one-shot or monostable multivibrator, and items 97 and 99 are each D type flip-flops. Presently used for each D flip-flop in FIGS. 4 and 6 is an IC D flip-flop available from Texas Instruments under vendor number SN 7474N. In referring to and identifying the flip-flop inputs and outputs hereinbelow, the item reference numerals will be employed as subscripts. One-shot 95, when triggered by a divider 39 output pulse, produces a pulse about 400 microseconds in duration. The purpose of the one-shot is to delay the clocking of flip-flops 97 and 99 400 microseconds from the occurrence of a divider 39 output pulse. As mentioned earlier, under no load conditions, the width of a pulse from pulse forming circuit 41, and from differential comparator circuit 53 is about 600 microseconds. Under load conditions said widths are considerably less. Although the shape of the pulses from 41 droops somewhat at the trailing edge, the no load pulse is still of sufficient magnitude at 400 microseconds to assure a logic "0" level at such time at the $D_{97}$ input. Similarly, the pulse under load has subsided sufficiently at 400 microseconds to assure a logic "1" level at such time at the $D_{97}$ input.

Connected as shown, flip-flop 97 transfers the $D_{97}$ logic level to the $Q_{97}$ output at the occurrence of an appropriate clock signal at $C_{97}$. $\overline{Q}_{97}$ is always the inverse of $Q_{97}$. So long as $\overline{Q}_{97}$, and thus $PRE_{99}$, is a logic "1", flip-flop 99 will operate the same as just described for flip-flop 97. Thus, with $PRE_{99}$ a logic "1", and $\overline{Q}_{99}$ being tied back to $D_{99}$, $Q_{99}$ will toggle between logic "0" and logic "1", changing from one to the other at each clock occurrence. However, when $\overline{Q}_{97}$, and thus $PRE_{99}$, is a logic "0", $Q_{99}$ is forced to a logic "1". So long as $PRE_{99}$ remains a logic "0", any $C_{99}$ and $D_{99}$ inputs are overridden and $Q_{99}$ remains a logic "1".

Thus, under no load conditions, $D_{97}$ is a logic "0" at the occurrence of a clock at $C_{97}$, and $\overline{Q}_{97}$ and $PRE_{99}$ become a logic "1". With $PRE_{99}$ at a logic "1", the output $Q_{99}$ begins to provide a square wave which, as will be seen from FIG. 6, causes the red LED to cycle on and off. Under load conditions, $D_{97}$ is a logic "1" at the occurrence of a clock at $C_{97}$, and $\overline{Q}_{97}$ and $PRE_{99}$ become a logic "0". With $PRE_{99}$ at a logic "0", the output $Q_{99}$ remains a logic "1" and eliminates the cycling of the red LED.

FIG. 5 shows the absolute value differential comparator circuit 71 as presently embodied. Items 101 and 103 are unipolar output, differential comparators. Diodes 105 and 107 protect the inputs to items 101 and 103 from voltage damage from static discharge. The remaining components are obvious to one skilled in the art.

Somewhat like FIG. 4, item 73 in FIG. 6 includes a one-shot 109 and two D type flip-flops 111 and 113. The pulse produced by 109 upon being triggered is 18 to 20 microseconds in duration. The purpose here is to delay the clocking of flip-flops 111 and 113 by a time sufficient to assure charging of any PCB reactive components. Also, some delay in pulse arrival at $D_{111}$ is occasioned by the comparator circuit 71. It should also be noted that absence or presence of a pulse of a predetermined magnitude is known from the $Q_{111}$ and $\overline{Q}_{111}$ outputs and thus detect circuit 73 may be implemented without flip-flop 113. However, flip-flop 113 is presently included so as to delay an indication of pulse presence until two successive pulses are received. The probability of incorrect indications is thus greatly reduced.

Flip-flop 111 is connected the same as and operates the same as flip-flop 97 in FIG. 4. Flip-flop 113, it should be noted, has neither of its preset or clear inputs tied to a constant logic level. As is known by those skilled in the art, with both $PRE_{113}$ and $CLR_{113}$ simultaneously a logic "0", $Q_{113}$ and $\overline{Q}_{113}$ are both forced to a logic "1" regardless of the $C_{113}$ and $D_{113}$ inputs. Also, with $PRE_{113}$ a logic "0" and $CLR_{113}$ a logic "1", $Q_{113}$ and $\overline{Q}_{113}$ are forced respectively to a logic "1" and a logic "0" regardless of the $C_{113}$ and $D_{113}$ inputs.

In operation then, and assuming no load conditions, $CLR_{113}$ cycles between a logic "1" and a logic "0" as described earlier for the $Q_{99}$ output in FIG. 4. Under no load conditions, since no pulses can be received by the probes, $D_{111}$ is a logic "1". Thus $Q_{111}$ and $PRE_{113}$ each becomes a logic "0" at a clock occurrence at $C_{111}$. Thus $Q_{113}$ remains a logic "1" throughout the no load condition and $\overline{Q}_{113}$ cycles between a logic "1" and a logic "0".

With the PCB properly connected to pulse forming circuit 41 (i.e., under load conditions), $CLR_{113}$ (which is connected to $Q_{99}$) becomes a logic "1" and remains so while the PCB is connected. If no pulse is received by the probes, $D_{111}$ becomes a logic "1", $\overline{Q}_{111}$ and $PRE_{113}$ each become a logic "0", and $Q_{113}$ and $\overline{Q}_{113}$ become respectively a logic "1" and a logic "0". When a first pulse is received by the probes, $D_{111}$ is a logic "0" during the occurrence of a clock at $C_{111}$, and thus $\overline{Q}_{111}$ and $PRE_{113}$ each become a logic "1". However, $Q_{113}$ and $\overline{Q}_{113}$ do not change at this time from "1" and "0" respectively but instead are "readied" to change with the next clock occurrence in accordance with the $D_{113}$ and $PRE_{113}$ levels at that time. If at this next clock occurrence no pulse is received, $D_{111}$ will become "1", $\overline{Q}_{111}$ and $PRE_{113}$ will each become "0", and $Q_{113}$ and $\overline{Q}_{113}$ will stay at "1" and "0" respectively. But, if at this next clock occurrence a second pulse is received, $D_{111}$, $\overline{Q}_{111}$, and $PRE_{113}$ will stay respectively "0", "1" and "1" and the flip-flop 113 outputs remain free to change in accordance with the level at $D_{113}$. With $D_{113}$ being "0" at this second or next clock occurrence, and with $Q_{113}$ and $\overline{Q}_{113}$ being free to respond, $Q_{113}$ and $\overline{Q}_{113}$ become respectively "0" and "1".

Turning now to driver 75 and indicator 77 in FIG. 6, items 115 and 117 are amplifiers, and items 119 and 121 are respectively a red LED and a green LED. When $PRE_{113}$ and $CLR_{113}$ are both "0", $Q_{113}$ and $\overline{Q}_{113}$ are both "1", and thus neither LED is energized because there is no voltage drop thereacross. But as $CLR_{113}$ cycles between "1" and "0" while $PRE_{113}$ remains at "0" (which happens under no load conditions), red LED 119 is alternately forward biased and then unbiased and thus flashes on and off. When $CLR_{113}$ is "1" and $PRE_{113}$ is "0" (which prevails during load conditions prior to a pulse reception) $Q_{113}$ and $\overline{Q}_{113}$ are respectively "1" and "0" and thus red LED 119 is constantly forward biased and is constantly on. When $CLR_{113}$ and $PRE_{113}$ are both "1", and $Q_{113}$ and $\overline{Q}_{113}$ are respectively "0" and "1" (which prevails following reception of two successive pulses) red LED 119 is constantly back biased and off, and green LED 119 is constantly forward biased and on.

Certain points which are at least implicit in the foregoing descriptions should here be emphasized. For instance, actual contact of the conductors results in extremely good system sensitivity and thus the injected pulses need not be large in magnitude. Moreover, since sensitivity is extremely good, the system effectiveness is relatively independent of effects of PCB components on pulse shape or amplitude. Also, since the injected pulses are of relatively low amplitude, risks of component or semiconductor junction breakdown are minimal. Also, since the injected pulse amplitude is relatively low and since an extremely low duty cycle is employed (typically about 0.03% to 0.3%) risk of heat damage to PCB components is practically nonexistent.

Furthermore, it is apparent that the system can be used with wired chassis types other than PCBs. Probe tip shapes other than pointed may be advantageous in such applications.

Also, the system may be used to locate multiple shorts. For instance, assume there is an additional short similar to 13 in FIG. 1 but that its location is between 19 and 20. After locating and correcting the short 13 between 27 and 28 essentially as hereinabove described, the indicator 77, with connectors 49 and 51 still connected to the PCB, would continue to indicate a load condition. The operator would then merely repeat the test procedure to locate the additional short.

Thus while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

I claim:

1. A system for locating an electrical short between PCB conductors, said system comprising:
   pulse generating means for injecting a low amplitude pulse train into the circuit path formed by said conductors and said short,
   first and second probe means suitable for contacting exclusively even a narrow width conductor closely adjacent another conductor,
   probe holding means for receiving said first and second probe means and maintaining a substantially constant small separation therebetween,
   indicator means having at least first and second indicating states, and
   means responsive to voltage differential between said first and second probe means for effecting a change in said indicator means from said first indicating state to said second indicating state only after the voltage differential between said probe means manifests reception by said probe means of at least two pulses of predetermined amplitude.

2. A system as defined in claim 1 wherein said means responsive to voltage differential comprises means for effecting said indicator means change from said first indicating state to said second indicating state only after there is manifested reception of at least two successive pulses of said pulse train.

3. A system as defined in claim 2 wherein said pulse train is a low duty cycle pulse train.

4. A system as defined in claim 3 including means for effecting a third indicating state when said circuit path is not connected to said pulse generating means.

5. A system as defined in claim 4 wherein said means responsive to voltage differential for effecting a change in indicator means state is responsive to said means for effecting a third indicating state.

6. A system as defined in claim 5 wherein said means responsive to voltage differential for effecting a change in indicator means state includes absolute value circuit means for making the operation of said voltage differential responsive means independent of the polarity of one probe means relative to the other probe means.

7. A system for locating an electrical short between PCB conductors, said system comprising:
pulse generating means for injecting a low amplitude pulse train of low duty cycle into the circuit path formed by said conductors and said short,
first and second probe means suitable for contacting exclusively even a narrow width conductor closely adjacent another conductor,
probe holding means for receiving said first and second probe means and maintaining a substantially constant small separation therebetween,
indicator means having at least first and second indicating states, and
means responsive to voltage differential between said first and second probe means for effecting a change in said indicator means from said first indicating state to said second indicating state only after the voltage differential between said probe means manifests reception by said probe means of a predetermined plural number of pulses of predetermined amplitude.

8. A system as defined in claim 7 wherein said predetermined number of pulses comprises at least two pulses.

9. A system as defined in claim 8 wherein the amplitude of said pulse train does not exceed approximately four volts.

10. A system as defined in claim 9 wherein said separation between probe means is approximately 0.3 inches.

11. A system as defined in claim 10 wherein said duty cycle is in the range of approximately 0.03% to approximately 0.3%.

12. A system for locating an electrical short between PCB conductors, said system comprising:
pulse generating means for injecting a pulse train into the circuit path formed by said conductors and said short,
first and second probe means suitable for contacting exclusively even a narrow width conductor closely adjacent another conductor,
probe holding means for receiving said first and second probe means and maintaining a substantially constant small separation therebetween,
indicator means having at least first, second, and third indicating states, and
means responsive to voltage differential between said first and second probe means for effecting a change in said indicator means from said first indicating state to said second indicating state only after the voltage differential between said probe means manifests reception by said probe means of a predetermined plural number of pulses of predetermined amplitude, and
means for effecting said third indicating state when said circuit path is not connected to said pulse generating means.

* * * * *